US012727405B2

(12) United States Patent
Zhang et al.

(10) Patent No.: US 12,727,405 B2
(45) Date of Patent: Sep. 1, 2026

(54) THERMAL CVD OF TITANIUM SILICIDE METHODS TO FORM SEMICONDUCTOR STRUCTURES

(71) Applicant: Applied Materials, Inc., Santa Clara, CA (US)

(72) Inventors: Shumao Zhang, San Jose, CA (US); Qihao Zhu, Sunnyvale, CA (US); Weifeng Ye, San Jose, CA (US); Liqi Wu, San Jose, CA (US); Jiang Lu, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 389 days.

(21) Appl. No.: 18/518,943

(22) Filed: Nov. 24, 2023

(65) Prior Publication Data

US 2025/0174456 A1 May 29, 2025

(51) Int. Cl.
*H10P 95/90* (2026.01)
*H10P 14/60* (2026.01)

(52) U.S. Cl.
CPC ...... *H10P 14/6334* (2026.01); *H10P 14/6682* (2026.01); *H10P 95/90* (2026.01)

(58) Field of Classification Search
CPC ... H10P 14/6334; H10P 14/6682; H10P 95/90
See application file for complete search history.

(56) References Cited

U.S. PATENT DOCUMENTS 6,830,820 B2 12/2004 Sandhu et al.
6,927,162 B1 8/2005 Yu et al.
8,785,310 B2 7/2014 Hasegawa et al.
10,103,028 B2 10/2018 Bauer
2001/0006240 A1 7/2001 Doan et al.
2003/0143841 A1* 7/2003 Yang ................. C23C 16/45531 438/653
2004/0127027 A1* 7/2004 Lee ..................... H10W 20/033 438/683
2014/0120712 A1 5/2014 Ganguli et al.
2014/0248761 A1 9/2014 Park et al.
(Continued)

FOREIGN PATENT DOCUMENTS

CN 111602228 A 8/2020
JP 2008112803 A 5/2008

OTHER PUBLICATIONS

PCT International Search Report and Written Opinion in PCT/US2024/056606 dated Mar. 10, 2025, 11 pages.
(Continued)

*Primary Examiner* — Eugene Lee
(74) *Attorney, Agent, or Firm* — SERVILLA WHITNEY LLC

(57) ABSTRACT

Methods of depositing titanium silicide (TiSi) in the formation of semiconductor structures are described. The methods include thermal chemical vapor deposition (CVD) in which a semiconductor substrate in a semiconductor processing chamber is exposed to a titanium-containing precursor, a silicon-containing precursor, and hydrogen ($H_2$) to deposit the titanium silicide (TiSi) layer directly on the semiconductor substrate. Methods of selectively depositing titanium silicide (TiSi) in the formation of semiconductor structures, e.g., an n-type transistor and a p-type transistor, are also described.

20 Claims, 6 Drawing Sheets

(56) References Cited

U.S. PATENT DOCUMENTS

| | | | | |
|---|---|---|---|---|
| 2015/0194298 | A1* | 7/2015 | Lei | C23C 16/45551 438/782 |
| 2017/0178927 | A1* | 6/2017 | Biggs | H10D 64/0112 |
| 2020/0091011 | A1* | 3/2020 | Khaderbad | H10D 84/0193 |
| 2020/0211852 | A1* | 7/2020 | Kuratomi | H01J 37/3244 |
| 2020/0266068 | A1* | 8/2020 | Li | H10D 64/0112 |
| 2020/0283896 | A1* | 9/2020 | Li | C23C 16/06 |
| 2021/0104433 | A1* | 4/2021 | Mukherjee | H10W 20/033 |
| 2022/0005704 | A1 | 1/2022 | Li et al. | |
| 2023/0115130 | A1 | 4/2023 | Yu | |
| 2023/0257404 | A1* | 8/2023 | Ikemura | C07F 7/28 438/685 |

OTHER PUBLICATIONS

Byun, Jeong Soo, et al., “Selective Titanium Silicide Deposition Using SiH4—TiCl4—H2 in Low-Pressure Chemical Vapor Deposition and Film Characterization”, J. Electrochem. Soc., vol. 145, No. 11, Nov. 1998, 11 pages.

Du, Jun , et al., “Preparation and properties of titanium silicidecoating glass by CVD”, Journal of Non-Crystalline Solids, vol. 354, Issues 12-13, Feb. 15, 2008, pp. 1308-1313.

Huang, Jacky , et al., “How FinFET Device Performance Is Affected By Epitaxial Process Variations”, Semiconductor Engineering, downloaded from the internet: <https://semiengineering.com/how-finfet-device-performance-is-affected-by-epitaxial-process-variations/> on Nov. 21, 2023, 11 pages.

Tantraviwat, Doldet , et al., “Schottky Barrier Height Engineering of Ti/n-Type Silicon Diode by Means of Ion Implantation”, Walailak J Sci & Tech 2018; 15(11): 803-809.

* cited by examiner

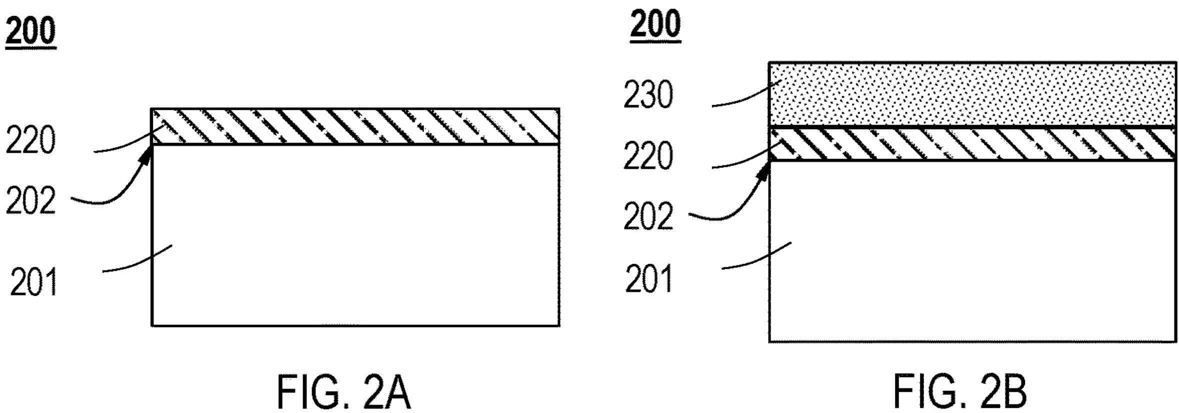
FIG. 2A
FIG. 2B
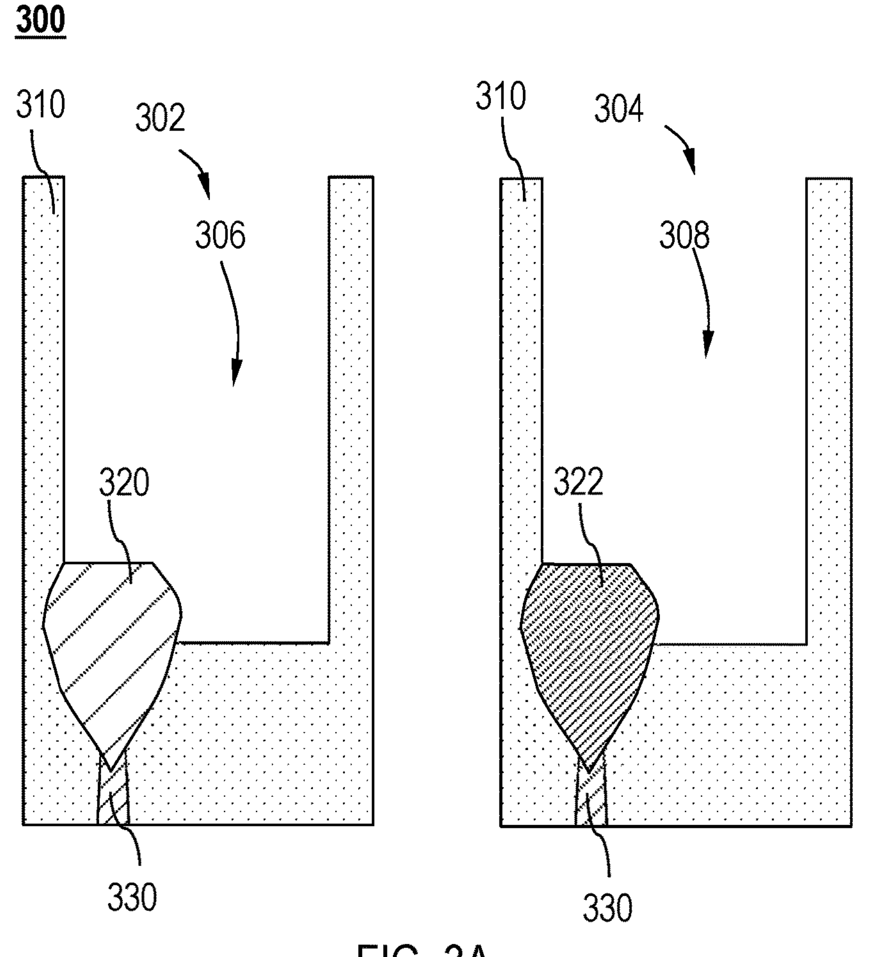
FIG. 3A

THERMAL CVD OF TITANIUM SILICIDE METHODS TO FORM SEMICONDUCTOR STRUCTURES

TECHNICAL FIELD

Embodiments of the present disclosure pertain to the field of semiconductor device manufacturing. More particularly, embodiments of the disclosure are directed to methods of depositing titanium silicide (TiSi) in the formation of semiconductor structures that achieve low contact resistance at source/drain contacts in transistors by reducing Schottky barrier height (SBH) to the source/drain.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Generally, front-end of line (FEOL) refers to the first portion of integrated circuit fabrication, including transistor fabrication, middle-of-line (MOL) connects the transistor and interconnect parts of a chip using a series of contact structures, and back-end of line (BEOL) refers to a series of process steps after transistor fabrication through completion of a wafer.

Current MOL fabrication processes employ direct plasma enhanced chemical vapor deposition (PECVD) process to deposit titanium silicide, which has poor selectivity, especially in features within a substrate. Selective deposition has shown promise in device miniaturization as it has the potential to remove costly lithographic steps by simplifying integration schemes. Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be tuned to modulate the chemical kinetics of a particular surface reaction. Another possible scheme involves surface pretreatments that can be used to activate or deactivate a surface of interest to an incoming layer deposition precursor.

To enable subsequent bottom-up selective tungsten (W) gapfill, a complicated and expensive pull-back process has been employed. Typically, this pull-back process includes a wet etch process or a dry etch process, both of which are facing challenges in trenches having small critical dimensions (CD) and decreasing technology nodes. It is also difficult to improve productivity of PECVD titanium silicide and extend the use of PECVD titanium silicide for decreasing technology nodes, for example, tungsten-filled gaps<15 nm, e.g., 7 nm.

Accordingly, there is a need in the art for methods of depositing titanium silicide (TiSi) with improved productivity performance, for example, one or more of reduced contact resistance and work function tunability.

SUMMARY

One or more embodiments of the disclosure are directed to a thermal CVD method of forming a semiconductor structure. The method comprises: exposing a semiconductor substrate in a semiconductor processing chamber to a titanium-containing precursor, a silicon-containing precursor, and hydrogen ($H_2$) to deposit a titanium silicide (TiSi) layer directly on the semiconductor substrate.

Additional embodiments of the disclosure are directed to a thermal CVD method of forming a semiconductor structure. The method comprises: pre-cleaning a semiconductor substrate in a semiconductor processing chamber to remove native oxides and form a cleaned semiconductor substrate; and exposing the cleaned semiconductor substrate to titanium tetrachloride ($TiCl_4$), silane ($SiH_4$), and hydrogen ($H_2$) by a thermal chemical vapor deposition (CVD) process to deposit a titanium silicide (TiSi) layer directly on the cleaned semiconductor substrate. In some embodiments, one or more of the titanium tetrachloride ($TiCl_4$) and the silane ($SiH_4$) are pulsed and purged while the hydrogen ($H_2$) and the other of the titanium tetrachloride ($TiCl_4$) and the silane ($SiH_4$) are continuously flowed in a carrier gas comprising argon (Ar).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 2A illustrates a cross-sectional view of a semiconductor substrate according to one or more embodiments of the present disclosure;

FIG. 2B illustrates a cross-sectional view of a semiconductor substrate according to one or more embodiments of the present disclosure;

FIG. 3A illustrates a cross-sectional view of a semiconductor structure according to one or more embodiments of the present disclosure;

DETAILED DESCRIPTION

Figure 1A:
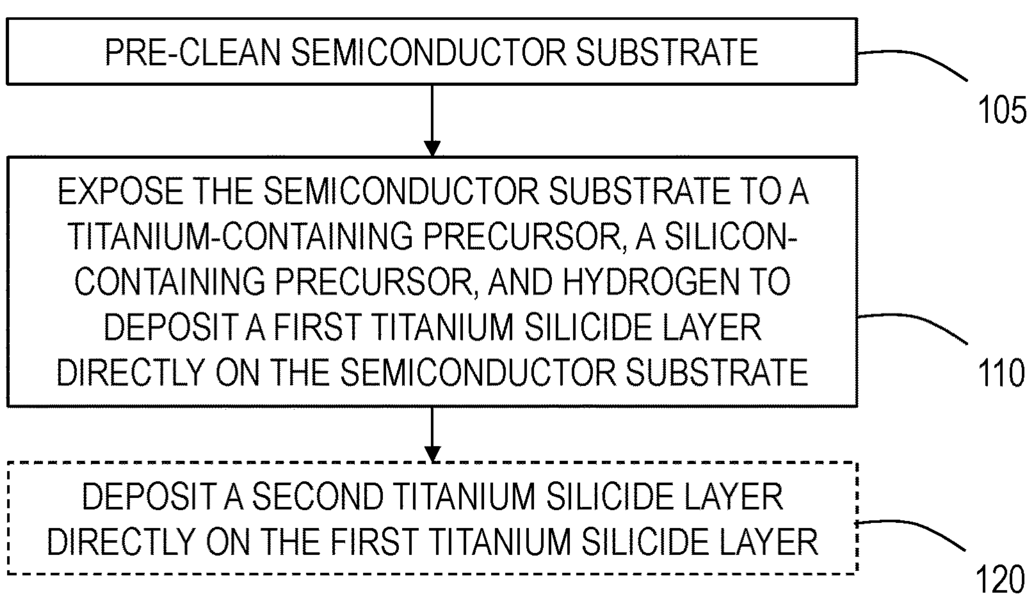
FIG. 1A illustrates a process flow diagram of a thermal CVD method of forming a semiconductor structure according to one or more embodiments of the present disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

Spatially relative terms, such as "beneath," "below," "lower," "above," "upper" and the like, may be used herein for ease of description to describe one element's relationship to another element(s) or feature(s) as illustrated in the Figures. It will be understood that the spatially relative terms are intended to encompass different orientations of the semiconductor device in use or operation in addition to the orientation depicted in the figures. For example, if the semiconductor device in the Figures is turned over, elements described as "below" or "beneath" other elements would then be oriented "above" the other elements. Thus, the exemplary term "below" may encompass both an orientation of above and below. The semiconductor device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments," "some embodiments," or "an embodiment" means that a particular feature, structure, material, or characteristic described in connection with the embodiment is included in at least one embodiment of the disclosure. Thus, the appearances of the phrases such as "in one or more embodiments," "in certain embodiments," "in some embodiments," "in one embodiment," or "in an embodiment" in various places throughout this specification are not necessarily referring to the same embodiment of the disclosure. In one or more embodiments, the particular features, structures, materials, or characteristics are combined in any suitable manner.

As used herein, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more layers or features deposited or formed thereon.

A "substrate" as used herein, refers to any substrate or material surface formed on a substrate upon which layer processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. In some embodiments, the semiconductor comprises one or more of doped or undoped crystalline silicon (Si), doped or undoped crystalline silicon germanium (SiGe), doped or undoped amorphous silicon (Si), or doped or undoped amorphous silicon germanium (SiGe). Substrates may be exposed to a pretreatment process to polish, etch, reduce, oxidize, hydroxylate, anneal and/or bake the substrate surface. In addition to layer processing directly on the surface of the substrate itself, in the present disclosure, any of the layer processing steps disclosed may also be performed on an under-layer formed on the substrate as disclosed in more detail below, and the term "substrate surface" is intended to include such under-layer as the context indicates. Thus, for example, where a layer/layer or partial layer/layer has been deposited onto a substrate surface, the exposed surface of the newly deposited layer/layer becomes the substrate surface.

For the avoidance of doubt, no stoichiometric ratios are implied by the identification of materials disclosed herein. For example, a SiO material contains silicon and oxygen, a SiN material contains silicon and nitrogen, and a TiSi material contains titanium and silicon. These elements may or may not be present at a 1:1 ratio, unless otherwise specified herein.

It will be appreciated that the processes described herein can be implemented on any substrate surface having one or more features formed therein, one or more layers formed thereon, and combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom, and slot vias. The features described herein can have any suitable aspect ratio (ratio of the depth of the feature to the width of the feature). In one or more embodiments, the aspect ratio of the features described herein is greater than or equal to about 1:1, 2:1, 5:1, 10:1, 15:1, 20:1, 25:1, 30:1, 35:1, or 40:1.

As used herein, the term "selectively" refers to a process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface "relative to" the other surface.

As used herein, "selective" deposition of materials can be accomplished in a variety of ways. For instance, some processes may have inherent selectivity to surfaces based on their surface chemistry. A chemical precursor may react selectively with one surface relative to another surface (metallic or dielectric). Process parameters such as pressure, substrate temperature, precursor partial pressures, and/or gas flows may be modulated to modulate the chemical kinetics of a particular surface reaction.

The term "on" indicates that there is direct contact between elements. The term "directly on" indicates that there is direct contact between elements with no intervening elements.

As used herein, the term "in situ" refers to processes that are all performed in the same processing chamber or within different processing chambers that are connected as part of an integrated processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air.

As used herein, the terms "precursor," "reactant," "reactive gas," and the like are used interchangeably to refer to any gaseous species that can react with the substrate surface.

As used herein, the term "chemical vapor deposition" refers to the exposure of at least one reactive compound to deposit a layer of material on the substrate surface. In some embodiments, the chemical vapor deposition (CVD) process comprises mixing the two or more reactive compounds in the processing chamber to allow gas phase reactions of the reactive compounds and deposition. In some embodiments, the CVD process comprises exposing the substrate surface to two or more reactive compounds simultaneously. In some embodiments, the CVD process comprises exposing the substrate surface to a first reactive compound continuously with an intermittent exposure to a second reactive compound. In some embodiments, the substrate surface undergoes the CVD reaction to deposit a layer having a predetermined thickness. In the CVD process, the layer can be deposited in one exposure to the mixed reactive compounds or can be multiple exposures to the mixed reactive compounds with purges between. In some embodiments, the substrate surface is exposed to the first reactive compound and the second reactive compound substantially simultaneously.

As used herein, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive compound is purged from the reaction chamber for a time duration in a range of from 0.1 seconds to 30 seconds, from 0.1 seconds to 10 seconds, from 0.1 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive compound.

"Cyclical deposition" or "atomic layer deposition (ALD) refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired layer or layer thickness is formed on the substrate surface. In either scenario, the ALD process of pulsing compound A, purge gas, compound B and purge gas is a cycle. A cycle can start with either compound A or compound B and continue the respective order of the cycle until achieving a layer with the predetermined thickness.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate formed between source and drain regions. The source and drain regions may include a doped region of a substrate and may exhibit a doping profile suitable for a particular application. The gate is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated IS and current entering the channel at the drain (D) is designated ID. Drain-to-source voltage is designated VDS. By applying voltage to gate (G), the current entering the channel at the drain (i.e., ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

Embodiments of the present disclosure advantageously provide methods of depositing titanium silicide (TiSi) layers for semiconductor structures. Some embodiments advantageously provide methods of depositing titanium silicide (TiSi) layers directly on a semiconductor substrate surface.

Some embodiments advantageously provide thermal methods of depositing titanium silicide (TiSi) layers without the use of plasma. Thermal methods that eliminate plasma from the process simplifies the hardware requirements, making the manufacturing system less complex. In addition, one or more embodiments of the thermal processes of the disclosure provide improved productivity and performance in terms of fewer particles and a reduced number of mean wafers between cleans (MWBC).

In one or more embodiments, the thermal methods are used to selectively deposit titanium silicide without the formation of a seed layer prior to deposition of the titanium silicide on the bottom of the semiconductor substrate. In specific embodiments, the thermal CVD process is performed without a plasma and without forming a seed layer. In other words, the titanium silicide is selectively deposited directly on the semiconductor substrate without the deposition of an intervening layer of material. As used herein, "seed layer" refers to layer that is deposited directly on the semiconductor substrate to promote the subsequent formation/growth of a bulk layer thereon. In some cases, a bulk layer cannot be deposited directly on the semiconductor substrate without the deposition of an intervening layer of material, in which case a seed layer is required to enable bulk deposition. Advantageously, in one or more embodiments, the titanium silicide is deposited directly on the semiconductor substrate as a bulk layer without the deposition of an intervening layer of material.

Some embodiments advantageously provide thermal CVD methods of depositing titanium silicide (TiSi) layers having reduced Schottky barrier height (SBH) compared to current methods of depositing titanium silicide (TiSi) layers. To improve contact resistance (Rc), there is a need to reduce the SBH at transistor junctions.

Some embodiments advantageously provide thermal CVD methods of forming a semiconductor structure which include selectively depositing titanium silicide (TiSi) layers on one surface relative to another surface. The deposition profile can be selectively depositing the titanium silicide (TiSi) layer only on an exposed semiconductor surface, bottom-up fashion, or super-conformal with bottom thickness much larger than sidewall. Some embodiments advantageously provide methods of selectively depositing titanium silicide (TiSi) horizontally or laterally where the semiconductor surface is exposed at a feature sidewall instead of bottom. Some embodiments advantageously provide methods of depositing titanium silicide (TiSi) in which the work function can be adjusted by adjusting one or more processing conditions. Use of the thermal processes disclosed according to one or more embodiments advantageously results in a reduction of the SBH barrier to n-type Si (n-Si) of the TiSi layer by 50-100 meV. This occurs by increasing one or more of deposition time, $SiH_4$ flow, or $H_2$ flow.

One or more embodiments provide a pathway to further reducing contact resistance (Rc) at the nMOS transistor junction that forms where the titanium silicide (TiSi) layer is deposited on the semiconductor substrate that is n-type.

The embodiments of the disclosure are described by way of the Figures, which illustrate semiconductor structures and methods of manufacturing semiconductor structures in accordance with one or more embodiments of the disclosure. The processes shown are merely illustrative possible uses for the disclosed processes, and the skilled artisan will recognize that the disclosed processes are not limited to the illustrated applications.

Figure 1B:
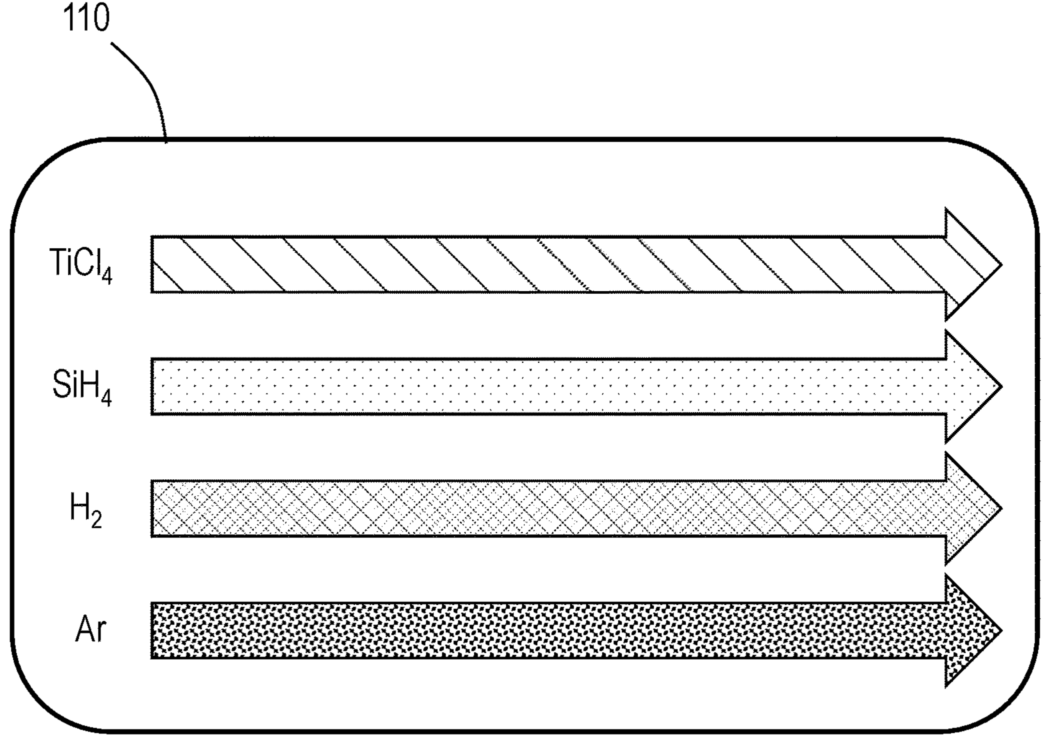
FIG. 1B illustrates an embodiment of depositing a titanium silicide (TiSi) layer in accordance with the present disclosure.
Figure 1C:
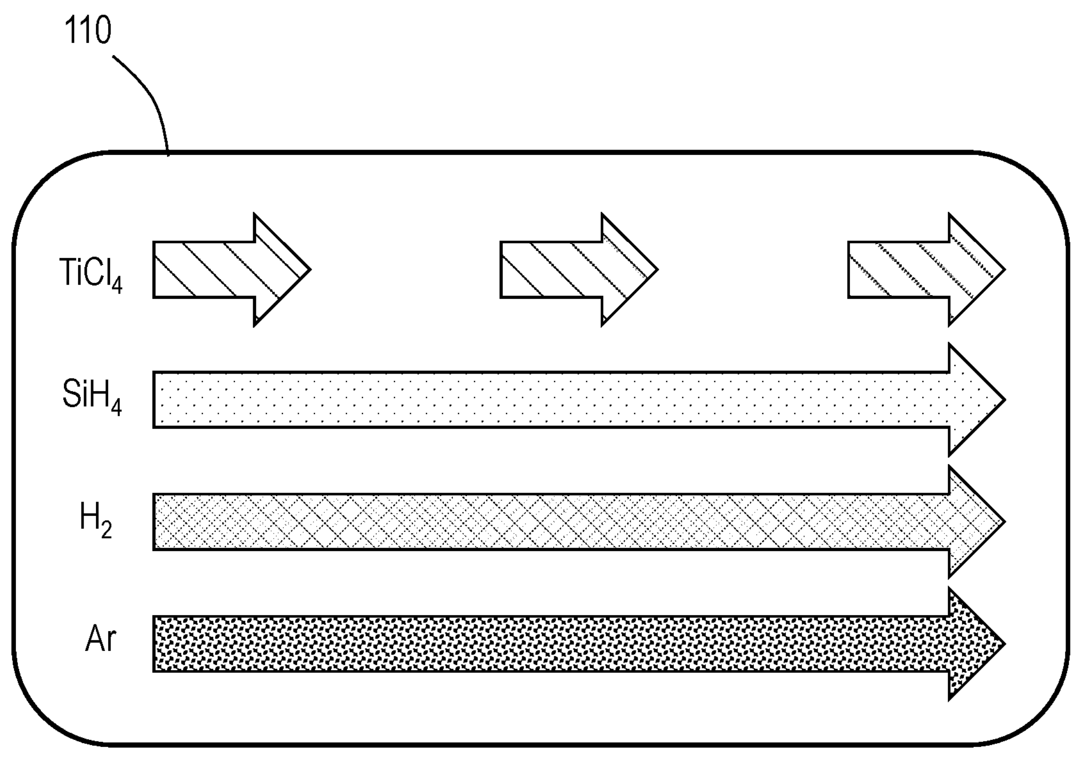
FIG. 1C illustrates an embodiment of depositing a titanium silicide (TiSi) layer in accordance with the present disclosure.
Figure 1D:
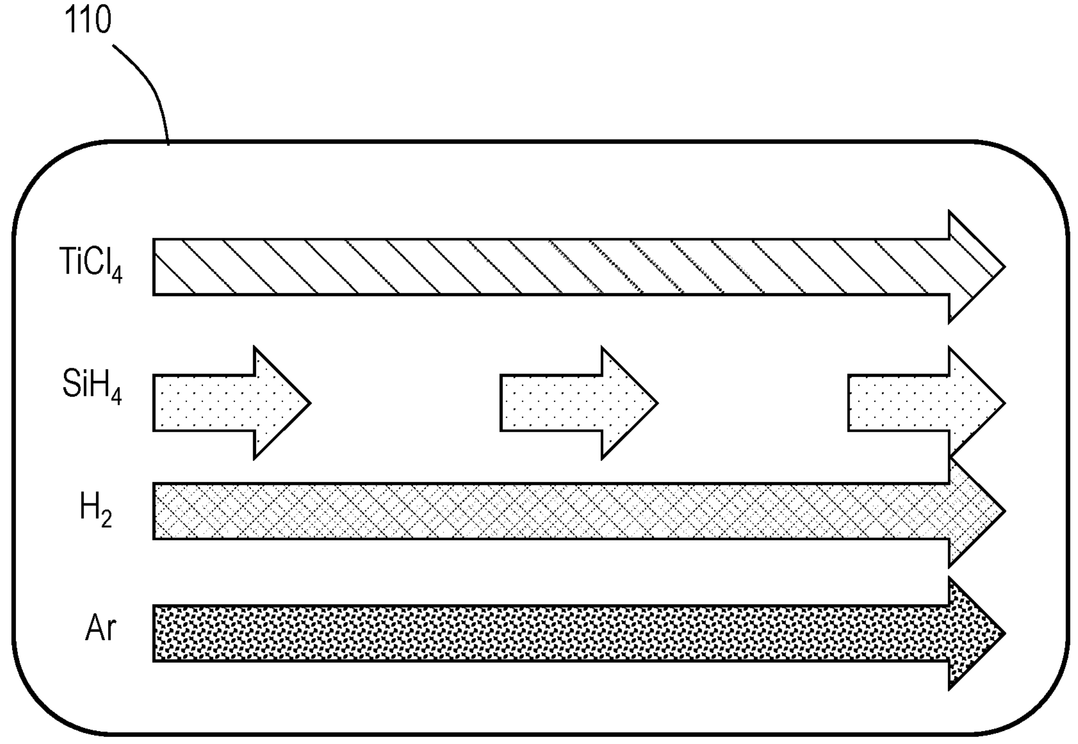
FIG. 1D illustrates an embodiment of depositing a titanium silicide (TiSi) layer in accordance with the present disclosure.

FIG. 1A illustrates a process flow diagram of a method 100 of manufacturing a semiconductor device according to one or more embodiments of the present disclosure. FIGS. 1B-1D illustrate embodiments of depositing a titanium silicide (TiSi) layer in accordance with the method 100.

Figures 3B, 3C:
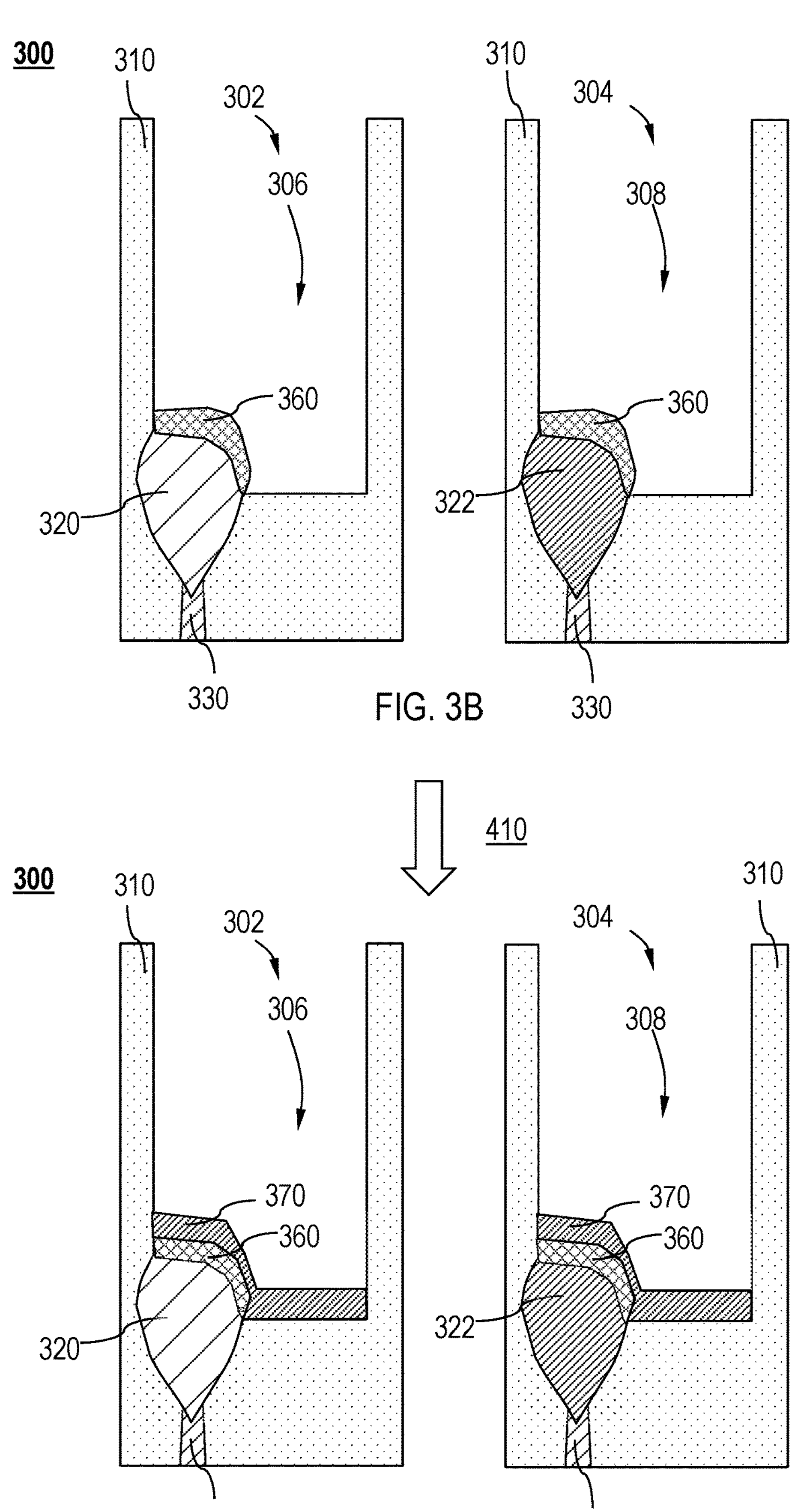
FIG. 3B illustrates a cross-sectional view of a semiconductor structure according to one or more embodiments of the present disclosure.
FIG. 3C illustrates a cross-sectional view of a semiconductor structure according to one or more embodiments of the present disclosure.

FIGS. 2A-2B are cross-sectional views of a semiconductor device 200 including a semiconductor substrate 201 during stages of manufacture according to one or more embodiments of the present disclosure. The semiconductor substrate 201 shown in FIGS. 2A-2B may be processed by the method 100 illustrated in FIG. 1A. FIGS. 3A-3D are cross-sectional views of a semiconductor structure 300 comprising an n-type transistor 302 and a p-type transistor 304. One or more operations of the method 100 may be implemented in the manufacture of the semiconductor structures 300 processed and illustrated in FIGS. 3A-3D. FIG. 4 illustrates a cluster tool 900 in which any of the semiconductor devices 200 and semiconductor structures 300 can be manufactured and any of the methods described herein can be performed.

The method 100 comprises pre-cleaning the semiconductor substrate 201 in a semiconductor processing chamber to remove native oxides (operation 105); exposing the semiconductor substrate 201 to a titanium-containing precursor, a silicon-containing precursor, and hydrogen ($H_2$) to deposit a titanium silicide (TiSi) layer (e.g., a first titanium silicide (TiSi) layer 220) directly on the semiconductor substrate 201 (operation 110); and optionally, depositing a second titanium silicide (TiSi) layer 230 directly on the first titanium silicide (TiSi) layer 220 (operation 120).

In one or more embodiments, the method 100 consists essentially of operation 105, operation 110, and operation 120. In one or more embodiments, the method 100 consists of operation 105, operation 110, and operation 120. In one or more embodiments, the method 100 consists of operation 105 and operation 110. In one or more embodiments, the method 100 consists of operation 110 and operation 120.

The semiconductor substrate 201 can be any suitable substrate material. In one or more embodiments, the semiconductor substrate 201 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 201 comprises one or more of silicon (Si), germanium (Ge), gallium (Ga), arsenic (As), indium (In), phosphorus (P), or selenium (Se). In some embodiments, the semiconductor substrate 201 comprises one or more of doped or undoped crystalline silicon (Si), doped or undoped crystalline silicon germanium (SiGe), doped or undoped amorphous silicon (Si), or doped or undoped amorphous silicon germanium (SiGe).

The method 100 includes pre-cleaning the semiconductor substrate 201 in a semiconductor processing chamber at operation 105. In one or more embodiments, keeping the pre-cleaning process under vacuum ensures that no oxide is introduced/formed on the substrate surface during the method. At operation 105, pre-cleaning the semiconductor substrate 201 removes native oxides from the substrate surface. The pre-cleaning process of operation 105 can be any suitable process. In some embodiments, the pre-cleaning process is a wet etch process or a dry etch process. In some embodiments, the pre-cleaning process includes using a SC-1 solution comprising one or more of ozone, ammonium hydroxide or hydrogen peroxide. In some embodiments, the pre-cleaning process includes using a SC-1 solution without ozone, ammonium hydroxide or hydrogen peroxide. In some embodiments, after using the SC-1 solution, the pre-cleaning process includes using dilute hydrofluoric acid (dilute HF), including greater than 100:1, such as 130:1 dilute HF, to etch away native oxide on the semiconductor substrate 201. In some embodiments, the pre-cleaning process includes using one or more gases of ammonia ($NH_3$), hydrofluoric acid (HF), nitrogen trifluoride ($NF_3$), or water ($H_2O$) with or without plasma at a temperature in a range of from −50° C. to 150° C.

In some embodiments, at operation 110, the method 100 includes exposing the semiconductor substrate 201 to a titanium-containing precursor, a silicon-containing precursor, and hydrogen ($H_2$) to deposit a titanium silicide (TiSi) layer 220 directly on the semiconductor substrate 201. Stated differently, the titanium silicide (TiSi) layer 220 is deposited directly on a top surface 202 of the semiconductor substrate 201.

Referring to FIGS. 1B-1D, the titanium silicide (TiSi) layer 220 may be deposited in a variety of ways in accordance with operation 110. Each of the ways of depositing the titanium silicide (TiSi) layer 220 at operation 110 (in FIGS. 1B-1D) are thermal CVD methods.

The titanium-containing precursor may be any suitable precursor. In some embodiments, the titanium-containing precursor comprises titanium tetrachloride ($TiCl_4$). The titanium-containing precursor may be flowed at any suitable flow rate and the flow rate may be adjusted based on the particular application. In some embodiments, the titanium-containing precursor, e.g., titanium tetrachloride ($TiCl_4$), is flowed in a range of from 1 sccm to 20 sccm. In some embodiments, the titanium-containing precursor, e.g., titanium tetrachloride ($TiCl_4$), is flowed in a range of from 2.5 sccm to 10 sccm. It has been found that flowing the titanium tetrachloride ($TiCl_4$) at a higher flow rate, e.g., greater than 20 sccm, leads to reduced thermal titanium silicide (TiSi) layer growth.

The silicon-containing precursor may be any suitable precursor. In some embodiments, the silicon-containing precursor comprises silane ($SiH_4$). The silicon-containing precursor may be flowed at any suitable flow rate and the flow rate may be adjusted based on the particular application. In some embodiments, the silicon-containing precursor, e.g., silane ($SiH_4$), is flowed in a range of from 100 sccm to 3000 sccm. In some embodiments, the silicon-containing precursor, e.g., silane ($SiH_4$), is flowed in a range of from 250 sccm to 2500 sccm. It has been found that flowing the silane ($SiH_4$) at a higher flow rate, e.g., greater than 2500 sccm, reduces selectivity in the deposition of the titanium silicide (TiSi) layer 220.

The hydrogen ($H_2$) may be flowed at any suitable flow rate and the flow rate may be adjusted based on the particular application. In some embodiments, the hydrogen ($H_2$) is flowed in a range of from 500 sccm to 10000 sccm. In some embodiments, the hydrogen ($H_2$) is flowed in a range of from 500 sccm to 7500 sccm.

The carrier gas, e.g., argon (Ar), may be flowed at any suitable flow rate and the flow rate may be adjusted based on the particular application. In some embodiments, the carrier gas, e.g., argon (Ar), is continuously flowed in a range of from 5 slm to 15 slm. In some embodiments, the carrier gas, e.g., argon (Ar), is continuously flowed in a range of from 8 slm to 13 slm.

FIG. 1B illustrates a thermal CVD method of depositing the titanium silicide (TiSi) layer 220 in the formation of a semiconductor structure wherein the titanium-containing precursor (e.g., titanium tetrachloride ($TiCl_4$)), the silicon-containing precursor (e.g., silane ($SiH_4$)), and the hydrogen ($H_2$) are continuously flowed in a carrier gas comprising argon (Ar). FIG. 1C illustrates a thermal CVD method of depositing the titanium silicide (TiSi) layer 220 wherein the titanium-containing precursor (e.g., titanium tetrachloride ($TiCl_4$)) is pulsed and purged while the silicon-containing precursor (e.g., silane ($SiH_4$)) and the hydrogen ($H_2$) are continuously flowed in a carrier gas comprising argon (Ar).

The method 100 including operation 110 as illustrated in FIG. 1C is a pulsed CVD (pCVD) method where at least one reactant is flowed constantly and at least one reactant is pulsed at a regular interval (e.g., pulsed intermittently) into the semiconductor processing chamber. In FIG. 1C, the titanium-containing precursor (e.g., titanium tetrachloride ($TiCl_4$)) is pulsed at a regular interval (e.g., pulsed intermittently) while the silicon-containing precursor (e.g., silane ($SiH_4$)) and the hydrogen ($H_2$) are constantly flowed in a carrier gas comprising argon (Ar).

FIG. 1D illustrates a thermal CVD method of depositing the titanium silicide (TiSi) layer 220 wherein the silicon-containing precursor (e.g., silane ($SiH_4$)) is pulsed and purged while the titanium-containing precursor (e.g., titanium tetrachloride ($TiCl_4$)) and the hydrogen ($H_2$) are continuously flowed in a carrier gas comprising argon (Ar).

The method 100 including operation 110 as illustrated in FIG. 1D is a pulsed CVD (pCVD) method where at least one reactant is flowed constantly and at least one reactant is pulsed at a regular interval (e.g., pulsed intermittently) into the semiconductor processing chamber. In FIG. 1D, the silicon-containing precursor (e.g., silane ($SiH_4$)) is pulsed at a regular interval (e.g., pulsed intermittently) while the titanium-containing precursor (e.g., titanium tetrachloride ($TiCl_4$)) and the hydrogen ($H_2$) are constantly flowed in a carrier gas comprising argon (Ar).

According to one or more embodiments, the semiconductor processing chamber in which the thermal CVD methods are performed can be maintained at any suitable temperature during the method 100. In one or more embodiments, the semiconductor processing chamber is maintained at a temperature in a range of from 300° C. to 600° C. In some embodiments, the semiconductor processing chamber is maintained at a temperature in a range of from 400° C. to 550° C., in a range of from 400° C. to 500° C., in a range of from 450° C. to 600° C., in a range of from 450° C. to 500° C.

The semiconductor processing chamber can be maintained at any suitable pressure during the method 100. In one or more embodiments, the semiconductor processing chamber is maintained at a pressure in a range of from 50 Torr to 100 Torr. It has been advantageously found that maintaining the semiconductor processing chamber at the pressure within the range of from 50 Torr to 100 Torr provides greater selectivity in the deposition of the titanium silicide (TiSi) layer 220.

The titanium silicide (TiSi) layer 220 may have any suitable thickness. In some embodiments, the titanium silicide (TiSi) layer 220 has a thickness in a range of from 5 Å to 120 Å. The skilled artisan will recognize that the particular thickness of the titanium silicide (TiSi) layer 220 may depend on the particular application. The exposures of operation 110 to deposit the titanium silicide (TiSi) layer 220 may include any suitable time period to deposit the titanium silicide (TiSi) layer 220 to a predetermined thickness. In one or more embodiments, the semiconductor substrate is exposed to the precursors of operation 110 for a time period in a range of from 0 seconds to 1500 seconds, or for a number of dosing pulse or cycle in a range of 0 to 1000 dosing pulses or cycles.

In one or more embodiments, according to operation 120 of method 100, a second titanium silicide (TiSi) layer 230 is deposited directly on the first titanium silicide (TiSi) layer 220. The deposition of the second titanium silicide (TiSi) layer 230 directly on the first titanium silicide (TiSi) layer 220 is illustrated in FIG. 2B. Accordingly, in specific embodiments, the first titanium silicide (TiSi) layer 220 acts as a seed layer or a nucleation layer for further deposition of a bulk layer thereon, e.g., the second titanium silicide (TiSi) layer 230.

The second titanium silicide (TiSi) layer 230 and the first titanium silicide (TiSi) layer 220 may be deposited by the same process. In one or more embodiments, the second titanium silicide (TiSi) layer 230 and the first titanium silicide (TiSi) layer 220 are deposited by the same process, e.g., operation 110. In one or more embodiments, the second titanium silicide (TiSi) layer 230 and the first titanium silicide (TiSi) layer 220 have the same composition.

As used herein, unless indicated otherwise, "the titanium silicide (TiSi) layer" can refer to the first titanium silicide (TiSi) layer 220 and/or the second titanium silicide (TiSi) layer 230. In one or more embodiments, the titanium silicide (TiSi) layer is continuous. In one or more embodiments, the titanium silicide (TiSi) layer is amorphous. In one or more embodiments, the titanium silicide (TiSi) layer is a nanocrystalline layer. In some embodiments, the titanium silicide (TiSi) layer has a ratio of titanium:silicon (Ti:Si) in a range of from 1:1 to 2:1. In one or more embodiments where the titanium silicide (TiSi) layer has a ratio of titanium:silicon (Ti:Si) in a range of from 1:1 to 2:1, the titanium silicide (TiSi) layer is a titanium-rich layer. In specific embodiments, the titanium silicide (TiSi) layer has a ratio of titanium: silicon (Ti:Si) of 1.5:1.

Additional embodiments advantageously provide thermal CVD methods of depositing titanium silicide (TiSi) layers having reduced Schottky barrier height (SBH) compared to current methods of depositing titanium silicide (TiSi) layers. When a metal is put in direct contact with a semiconductor, an electrical contact is formed. Generally, SBH refers to the difference between the metal work function and the electron affinity of the semiconductor, which represents the required energy for electron or hole to transfer from one side to the other side. Theoretically, the current passing through junction is inversely proportional to SBH and the contact resistance is proportional to SBH in an exponential rate. A lower SBH gives a lower contact resistance and improves device performance. It has advantageously been found that increasing deposition time period, increasing the flow ratio of the silicon-containing precursor (e.g., silane ($SiH_4$)) and increasing the flow ratio of the hydrogen ($H_2$) provides a reduced Schottky barrier height (SBH) compared to current methods of depositing titanium silicide (TiSi) layers.

Some embodiments advantageously provide thermal CVD methods of selectively depositing titanium silicide (TiSi) layers on one surface relative to another surface. FIGS. 3A-3D illustrate a processing method including selective deposition of a titanium silicide (TiSi) layer 360 and further semiconductor manufacturing process operations. It will be understood that the disclosure is not limited to the process steps set forth in FIGS. 3A-3D, as will be described further below.

In one or more embodiments, a substrate may be patterned to form at least one of a first opening 306 and a second opening 308. In one or more embodiments, patterning the substrate comprises using one or more patterning techniques known to one of ordinary skill in the art of microelectronic device manufacturing. In some embodiments, the semiconductor structure 300 is provided and no patterning to form the semiconductor structure 300 is required. In one or more embodiments, the semiconductor structure 300 is precleaned according to operation 105 of method 100.

Semiconductor structures 300 are shown in FIGS. 3A-3D during stages of manufacture. The semiconductor structure 300 comprises an n-type transistor 302 and a p-type transistor 304. In one or more embodiments, each of the n-type transistor 302 and the p-type transistor 304 comprise a dielectric material 310, a source/drain material 320, 322, and a semiconductor substrate 330.

In one or more embodiments, the dielectric material 310 may comprise any suitable dielectric material known to the skilled artisan. As used herein, the term "dielectric material" refers to an electrical insulator that can be polarized in an electric field. In some embodiments, the dielectric material 310 comprises one or more of silicon, silicon oxide, silicon nitride, silicon carbide, and low-K dielectrics. In some embodiments, the dielectric material 310 comprises one or more of silicon oxide (SiO), silicon nitride (SiN), or carbon-doped silicon oxide (SiOC). In some embodiments, the dielectric material 310 comprises silicon oxide (SiO). In some embodiments, the dielectric material 310 comprises silicon nitride (SiN). In some embodiments, the dielectric material 310 comprises carbon-doped silicon oxide (SiOC).

In some embodiments, the n-type transistor 302 and the p-type transistor 304 comprise source and drain contacts. In one or more embodiments, the source/drain material 320, 322 may have more than one layer.

In some embodiments, the source/drain material 320 of the n-type transistor 302 and/or the source/drain material 322 of the p-type transistor 304 is a metallic material. In some embodiments, the source/drain material 320 of the n-type transistor 302 and/or the source/drain material 322 of the p-type transistor 304 comprises one or more of doped or undoped crystalline silicon (Si), doped or undoped crystalline silicon germanium (SiGe), doped or undoped amorphous silicon (Si), or doped or undoped amorphous silicon germanium (SiGe). In one or more embodiments, the source/drain material 320 of the n-type transistor 302 and/or the source/drain material 322 of the p-type transistor 304 comprises silicon (Si) (crystalline silicon (Si) or amorphous silicon (Si)) doped with phosphorous (P) or boron (B). In one or more embodiments, the source/drain material 320 of the n-type transistor 302 and/or the source/drain material 322 of the p-type transistor 304 comprises metallic materials, such as one or more of doped or undoped crystalline silicon (Si), doped or undoped crystalline silicon germanium (SiGe), doped or undoped amorphous silicon (Si), or doped or undoped amorphous silicon germanium (SiGe), and dielectric materials, such as one or more of silicon oxide (SiO), silicon nitride (SiN), or carbon-doped silicon oxide (SiOC).

In one or more embodiments, the first opening 306 is over the n-type transistor 302 and the second opening 308 is over the p-type transistor 304. As used herein, the "first opening 306" and the "opening 306" each refer to the opening over the n-type transistor 302, and the "second opening 308" and the "opening 308" each refer to the opening over the p-type transistor 304. The first and second openings 306, 308 can have any suitable critical dimension (CD), which refers to the width of the respective first and second openings 306, 308.

In one or more embodiments, the critical dimension (CD) of one or more of the first and/or second openings 306, 308 is in a range of from 1 nm and less than about 30 nm, such in the range of from 1 nm to less than about 20 nm. In some embodiments, the critical dimension (CD) is in a range of from about 6 nm to about 20 nm, in a range of from about 6 nm to about 20 nm or in a range of from about 6 nm to about 15 nm.

As an example, the processes performed and layers formed according to one or more embodiments of the disclosure will be described with respect to the n-type transistor 302, or in each of the n-type transistor 302 and the p-type transistor 304.

The titanium silicide (TiSi) layer 360 selectively forms on one or more of the source/drain material 320 of the n-type transistor 302, or on the source/drain material 322 of the p-type transistor 304. In FIG. 3B, the titanium silicide (TiSi) layer 360 selectively forms on the source/drain material 320 of the n-type transistor 302 and on the source/drain material 322 of the p-type transistor 304. The titanium silicide (TiSi) layer 360 may be selectively deposited by operation 110. The titanium silicide (TiSi) layer 360 may have the same properties of the first titanium silicide (TiSi) layer 220 and the second titanium silicide (TiSi) layer 230.

It has been found that the ratio of titanium-containing precursor:silicon-containing precursor affects the selectivity of the deposition. For example, it has been found that there was no deposition of titanium (Ti) when the ratio of titanium-containing precursor:silicon-containing precursor (e.g., the ratio of $TiCl_4$:$SiH_4$) is greater than 1:50.

It has been found that there was highly selective deposition of titanium (Ti) on the source/drain material 320, 322 comprising silicon (Si) relative to the dielectric material 310 comprising one or more of silicon oxide (SiO), silicon nitride (SiN), or carbon-doped silicon oxide (SiOC) when the ratio of titanium-containing precursor:silicon-containing precursor (e.g., the ratio of $TiCl_4$:$SiH_4$) was in a range of from 1:100 to 1:200. Stated differently, when the ratio of titanium-containing precursor:silicon-containing precursor (e.g., the ratio of $TiCl_4$:$SiH_4$) was in a range of from 1:100 to 1:200, there was deposition of titanium (Ti) on the source/drain material 320, 322 comprising silicon (Si) relative to the dielectric material 310 comprising one or more of silicon oxide (SiO), silicon nitride (SiN), or carbon-doped silicon oxide (SiOC).

In FIG. 3C, the semiconductor structure 300 is further processed according to operation 410. At operation 410, a capping layer 370 is formed on the titanium silicide (TiSi) layer 360. In one or more embodiments, the capping layer 370 is selectively formed on a top surface of titanium silicide (TiSi) layer 360.

The capping layer 370 may comprise any suitable material known to the skilled artisan. In one or more embodiments, the capping layer 370 is selected from one or more of titanium nitride (TiN), tantalum nitride (TaN), tungsten nitride (WN), molybdenum nitride (MoN), tungsten (W), molybdenum (Mo), and ruthenium (Ru). In one or more embodiments, the capping layer 370 prevents formation of oxides on the titanium silicide (TiSi) layer 360.

In additional embodiments, the capping layer 370 is selectively formed on the top surface of titanium silicide (TiSi) layer 360 through the nitridation of the titanium silicide (TiSi) layer 360 by one or more of ammonia ($NH_3$) plasma, $N_2$/$H_2$ plasma, or the like. In one or more unillustrated embodiments, a second capping layer is deposited on the capping layer 370 (e.g., a first capping layer). In one or more embodiments, the first capping layer 370 comprises one or more of selectively deposited tungsten (W) or selectively deposited molybdenum (Mo), and the second capping layer comprises one or more of PVD tungsten (W) or PVD molybdenum (Mo).

Figure 3D:
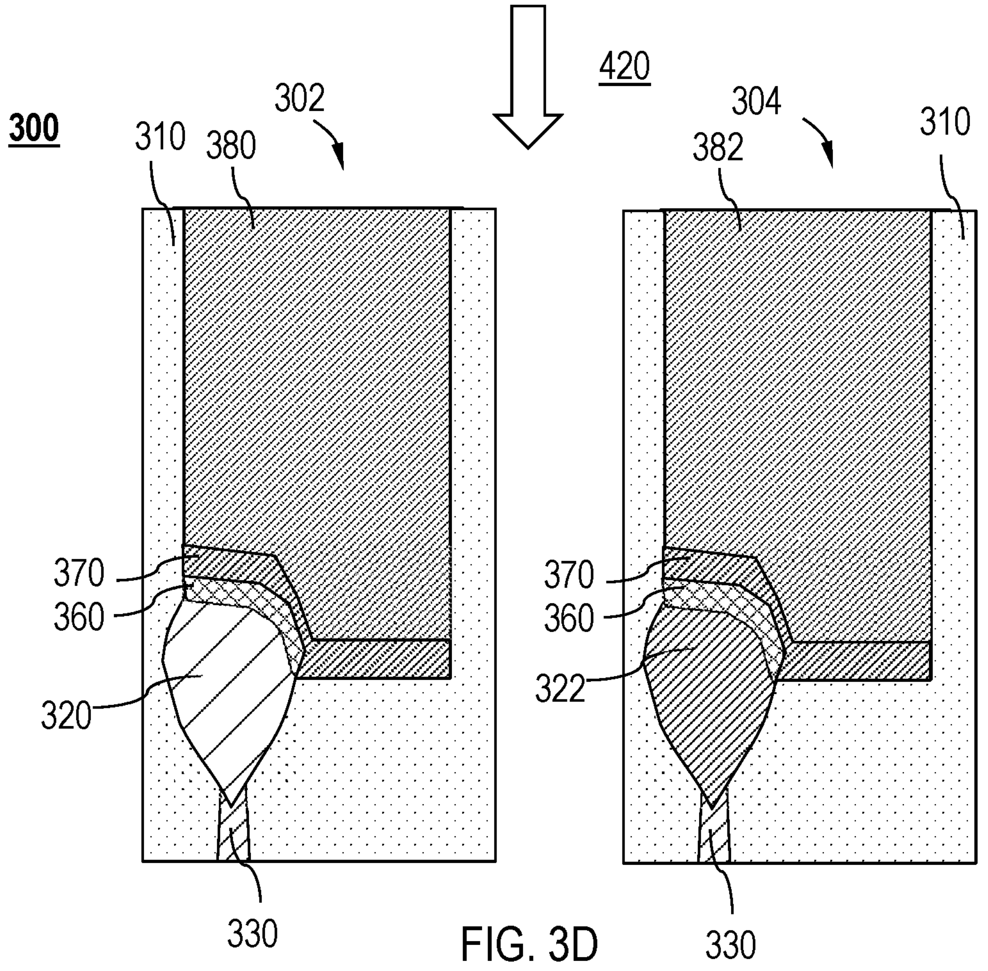
FIG. 3D illustrates a cross-sectional view of a semiconductor structure according to one or more embodiments of the present disclosure.
Figure 4:
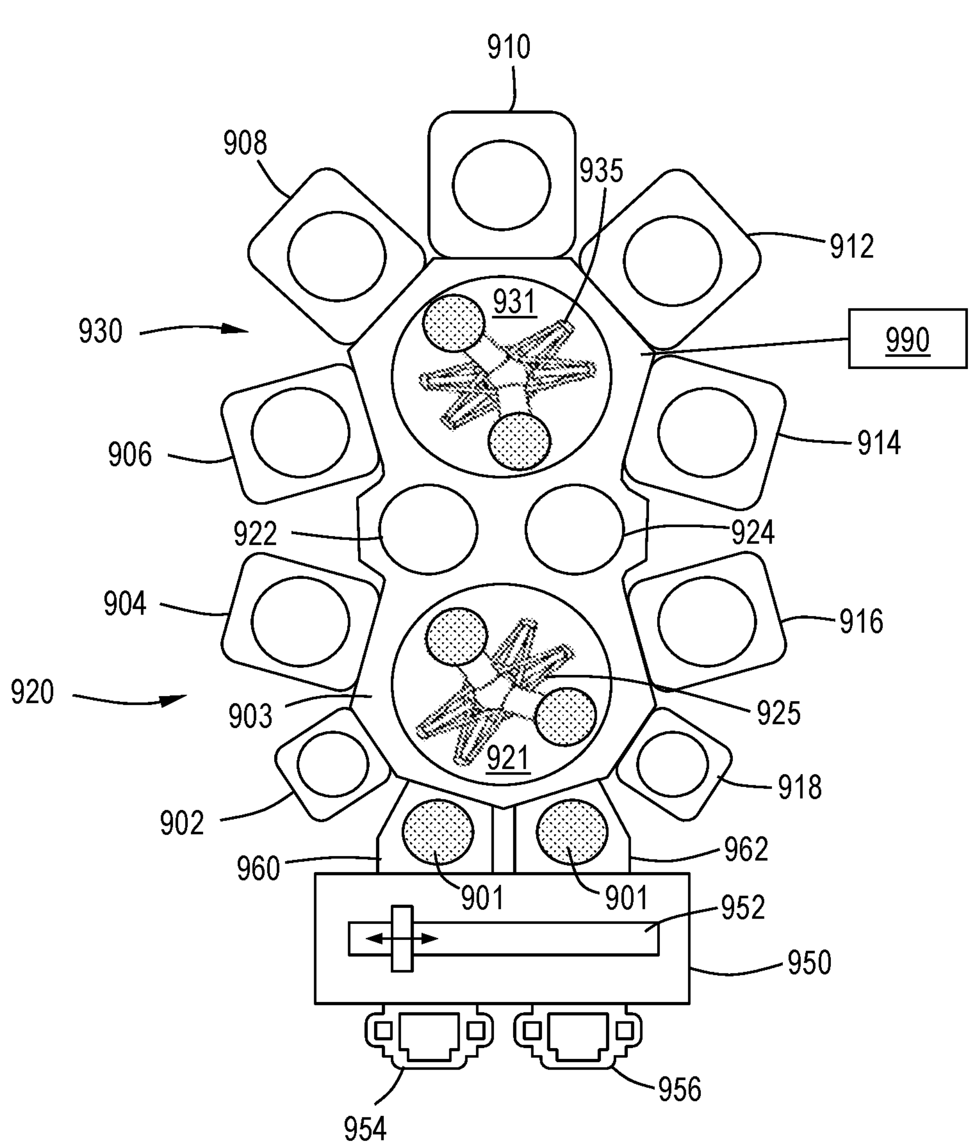
FIG. 4 illustrates a cluster tool according to one or more embodiments of the present disclosure.

In FIG. 3D, the semiconductor structure 300 is further processed according to operation 420. At operation 420, the first opening 306 over the n-type transistor 302 is filled with a gap fill material 380 and the second opening 308 over the p-type transistor 304 is filled with a gap fill material 382. The gap fill material 380 and the gap fill material 382 may be the same. In one or unillustrated embodiments, a selective metal removal process is performed prior to filling the first and second openings 306, 308 of the respective n-type transistor 302 and p-type transistor 304 with the gap fill material 380, 382. The selective metal removal process may be any suitable process known to the skilled artisan that removes residue from the sidewall and field. In one or more embodiments, the selective metal removal process includes the pre-cleaning process (e.g., operation 105) described herein.

Referring again to FIG. 3D, the gap fill material 380, 382 is substantially free of seams and/or voids or free of seams and/or voids. As used in this regard, "substantially free" means that less than about 5%, including less than about 4%, less than about 3%, less than about 2%, less than about 1%, less than about 0.5%, and less than about 0.1% of the total composition of the gap fill material 380, 382 an atomic basis, comprises seams and/or voids.

The gap fill material 380, 382 may comprise any suitable gap fill materials known to the skilled artisan. In one or more embodiments, the gap fill material 380, 382 comprises one or more of tungsten (W), molybdenum (Mo), cobalt (Co), and ruthenium (Ru). In one or more embodiments, the gap fill material 380, 382 comprises tungsten (W). In one or more embodiments, the gap fill material 380, 382 comprises molybdenum (Mo). In one or more embodiments, the gap fill material 380, 382 comprises cobalt (Co). In one or more embodiments, the gap fill material 380, 382 comprises ruthenium (Ru).

The gap filling process may comprise any suitable gap filling process known to the skilled artisan. In one or more embodiments, the gap filling process comprises exposing the semiconductor structure 300 to a metal precursor and a reactant. In some embodiments, the metal precursor comprises one or more of a molybdenum precursor, a tungsten precursor, a cobalt precursor, and a ruthenium precursor.

In some embodiments, the gap filling process is a bottom-up gap filling process. In some embodiments, the gap filling process is a CVD process. In some embodiments, the gap filling process comprises a conformal gap filling process.

In some embodiments, a liner comprising one or more of tungsten (W) or molybdenum (Mo) is deposited in the semiconductor structure 300 prior to filling the first and second openings 306, 308 with the gap fill material 380, 382. Accordingly, in specific embodiments, the liner acts as a seed layer or a nucleation layer for further deposition of a bulk layer thereon, e.g., the gap fill material 380, 382 comprising one or more of tungsten (W) or molybdenum (Mo).

The processing method according to one or more embodiments includes pre-cleaning (operation 105), thermal CVD of titanium silicide (TiSi) (operation 110), forming a capping layer comprising one or more of tungsten (W) or molybdenum (Mo) (operation 410), and filling the first and second openings 306, 308 with the gap fill material 380, 382 (one or more of tungsten (W) or molybdenum (Mo)) by a bottom-up gap filling process.

The processing method according to one or more embodiments includes pre-cleaning (operation 105), thermal CVD of titanium silicide (TiSi) (operation 110), forming a capping layer comprising one or more of tungsten (W) or molybdenum (Mo) (operation 410), performing a selective metal removal process (e.g., operation 105) and filling the first and second openings 306, 308 with the gap fill material 380, 382 (one or more of tungsten (W) or molybdenum (Mo)) by a bottom-up gap filling process.

The processing method according to one or more embodiments includes pre-cleaning (operation 105), thermal CVD of titanium silicide (TiSi) (operation 110), forming a capping layer 370 comprising one or more of tungsten (W) or molybdenum (Mo) (operation 410), forming a second capping layer (not shown in the Figures) comprising one or more of PVD tungsten (W) or PVD molybdenum (Mo) on the capping layer 370, performing a selective metal removal process (e.g., operation 105) and filling the first and second openings 306, 308 with the gap fill material 380, 382 (one or more of tungsten (W) or molybdenum (Mo)) by a bottom-up gap filling process.

The processing method according to one or more embodiments includes pre-cleaning (operation 105), thermal CVD of titanium silicide (TiSi) (operation 110), forming a capping layer using a plasma nitridation process comprising one or more of ammonia ($NH_3$) plasma, $N_2/H_2$ plasma, or atomic layer deposition (ALD) titanium nitride (TiN) (operation 410), depositing a liner comprising one or more of tungsten (W) or molybdenum (Mo) by PVD, and filling the first and second openings 306, 308 with the gap fill material 380, 382 (one or more of tungsten (W) or molybdenum (Mo)) on the liner by a bottom-up gap filling process.

Additional embodiments of the disclosure are directed to processing tools (i.e., a cluster tool) 900 for the formation of the semiconductor devices and methods described, as shown in FIG. 4. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station 921, 931. The various processing chambers provide separate processing regions isolated from adjacent process stations. The processing chamber can be any suitable chamber including, but not limited to, a pre-cleaning chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and a chemical vapor deposition (CVD) chamber, including a thermal CVD chamber.

In one or more embodiments, the cluster tool 900 is an integrated system such that the operations of method 100 are performed in situ. In some embodiments, one or more of the operations of method 100 are performed ex situ in the cluster tool 900.

In one or more embodiments, the cluster tool 900 includes a pre-cleaning chamber connected to the central transfer station. In one or more embodiments, the cluster tool 900 includes a pre-cleaning chamber and a CVD chamber connected to the central transfer station, such that there is no vacuum break in between the operations of method 100.

In one or more embodiments, the CVD chamber includes a single chamber for exposing the semiconductor substrate 201 to a titanium-containing precursor, a silicon-containing precursor, and hydrogen ($H_2$) to deposit a titanium silicide (TiSi) layer (e.g., a first titanium silicide (TiSi) layer 220) directly on the semiconductor substrate 201 (operation 110); and optionally, depositing a second titanium silicide (TiSi) layer 230 directly on the first titanium silicide (TiSi) layer 220 (operation 120), such that there is no vacuum break in between the operations.

In one or more embodiments, the CVD chamber includes a single chamber for each of exposing the semiconductor substrate 201 to a titanium-containing precursor, a silicon-containing precursor, and hydrogen ($H_2$) to deposit a titanium silicide (TiSi) layer (e.g., a first titanium silicide (TiSi) layer 220) directly on the semiconductor substrate 201 (operation 110); and optionally, depositing a second titanium silicide (TiSi) layer 230 directly on the first titanium silicide (TiSi) layer 220 (operation 120), such that there is a vacuum break in between at least one of the operations.

The particular arrangement of processing chambers and components can be varied depending on the cluster tool and should not be taken as limiting the scope of the disclosure.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

The cluster tool 900 shown in FIG. 4 has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, processing chambers 902, 904, 916, 918, and pass-through chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or to allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes the processing chamber to perform the operations of any of the methods described herein. In one or more embodiments, the controller causes the processing chamber to perform one or more of the operations of the method 100. In one or more embodiments, the controller causes the processing chamber to perform one or more of the operations of the processing methods described with respect to FIGS. 3A-3D.

In one or more embodiments, the cluster tool 900 comprises a central transfer station 921, 931 comprising at least one robot 925, 935 configured to move a wafer; one or more of a rapid thermal processing (RTP) station, a decoupled plasma oxidation (DPO), or decoupled plasma nitridation (DPN) station connected to the central transfer station; a chemical vapor deposition (CVD) station, including a thermal CVD station, connected to the central transfer station; an optional pre-cleaning station connected to the central transfer station; and at least one controller connected to the one or more of the central transfer station, the RTP station, the DPO station, the DPN station, the CVD station or the optional pre-clean station. In one or more embodiments, the at least one controller has at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide layer by atomic layer deposition; and a configuration to pre-cleaning the wafer.

The disclosure is now described with reference to the following Inventive Example. Before describing several exemplary embodiments of the disclosure, it is to be understood that the disclosure is not limited to the details of construction or process steps set forth in the following description. The disclosure is capable of other embodiments and of being practiced or being carried out in various ways.

Inventive Example

A titanium silicide (TiSi) layer was formed on a variety of different semiconductor substrates following the operations of method 100. The semiconductor substrates include a first surface comprising doped or undoped crystalline silicon (Si), doped or undoped crystalline silicon germanium (SiGe), doped or undoped amorphous silicon (Si), or doped or undoped amorphous silicon germanium (SiGe) and a second surface comprising one or more of silicon oxide (SiO), silicon nitride (SiN), or carbon-doped silicon oxide (SiOC).

It was advantageously found that the titanium silicide (TiSi) layer formed selectively on the first surface (each of the doped and undoped crystalline silicon (Si), doped and undoped crystalline silicon germanium (SiGe), doped and undoped amorphous silicon (Si), and doped and undoped amorphous silicon germanium (SiGe)) relative to the second surface (one or more of silicon oxide (SiO), silicon nitride (SiN) or carbon-doped silicon oxide (SiOC)). Accordingly, the titanium silicide (TiSi) layer formed in the Inventive Example exhibited improved selectivity.

Additionally, the titanium silicide (TiSi) layers of Inventive Example were formed by thermal CVD methods, which did not include the use of plasma, which simplifies the hardware design complexity of the semiconductor processing chamber and improves productivity performance of the deposition in terms of particle performance and mean wafer between cleaning (MWBC). In one or more experiments of Inventive Example, the titanium silicide (TiSi) layer is a titanium-rich layer. The titanium silicide (TiSi) layers of Inventive Example had a reduced Schottky barrier height (SBH) compared to current methods of depositing titanium silicide (TiSi) layers.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising:

exposing a semiconductor structure including a semiconductor substrate in a semiconductor processing chamber to a first titanium-containing precursor, a first silicon-containing precursor, and a first reactant comprising hydrogen ($H_2$) to deposit a first titanium silicide (TiSi) layer directly on the semiconductor substrate; and exposing the semiconductor substrate to a second titanium-containing precursor, a second silicon-containing precursor, and a second reactant comprising hydrogen ($H_2$) to deposit a second titanium silicide (TiSi) layer directly on the first titanium silicide (TiSi) layer, wherein each of the first titanium silicide (TiSi) layer and the second titanium silicide (TiSi) layer is independently deposited by thermal CVD, and the first titanium silicide (TiSi) layer is configured as a nucleation layer for further deposition of the second titanium silicide (TiSi) layer thereon.

2. The method of claim 1, wherein the semiconductor substrate comprises one or more of doped or undoped crystalline silicon (Si), doped or undoped crystalline silicon germanium (SiGe), doped or undoped amorphous silicon (Si), or doped or undoped amorphous silicon germanium (SiGe).

3. The method of claim 1, further comprising pre-cleaning the semiconductor substrate to remove native oxides prior to depositing the first titanium silicide (TiSi) layer.

4. The method of claim 1, wherein the first titanium-containing precursor, the first silicon-containing precursor, and the first reactant comprising hydrogen ($H_2$) are continuously flowed in a carrier gas comprising argon (Ar), and the second titanium-containing precursor, the second silicon-containing precursor, and the second reactant comprising hydrogen ($H_2$) are continuously flowed in a carrier gas comprising argon (Ar).

5. The method of claim 1, wherein the first titanium-containing precursor is pulsed and purged while the first silicon-containing precursor and the first reactant comprising hydrogen ($H_2$) are continuously flowed in a carrier gas comprising argon (Ar), and the second titanium-containing precursor is pulsed and purged while the second silicon-containing precursor and the second reactant comprising hydrogen ($H_2$) are continuously flowed in a carrier gas comprising argon (Ar).

6. The method of claim 1, wherein the first silicon-containing precursor is pulsed and purged while the first titanium-containing precursor and the first reactant comprising hydrogen ($H_2$) are continuously flowed in a carrier gas comprising argon (Ar), and the second silicon-containing precursor is pulsed and purged while the second titanium-containing precursor and the second reactant comprising hydrogen ($H_2$) are continuously flowed in a carrier gas comprising argon (Ar).

7. The method of claim 1, wherein one or more of the first titanium-containing precursor and the second titanium-containing precursor comprise titanium tetrachloride ($TiCl_4$).

8. The method of claim 7, wherein the titanium tetrachloride ($TiCl_4$) is flowed in a range of from 1 sccm to 20 sccm.

9. The method of claim 1, wherein one or more of the first silicon-containing precursor and the second silicon-containing precursor comprise silane ($SiH_4$).

10. The method of claim 9, wherein the silane ($SiH_4$) is flowed in a range of from 100 sccm to 3000 sccm.

11. The method of claim 1, wherein one or more of the first reactant comprising hydrogen ($H_2$) and the second reactant comprising hydrogen ($H_2$) are flowed in a range of from 500 sccm to 10000 sccm.

12. The method of claim 1, wherein the semiconductor processing chamber is maintained at a temperature in a range of from 300° C. to 600° C.

13. The method of claim 1, wherein the semiconductor processing chamber is maintained at a pressure in a range of from 50 Torr to 100 Torr.

14. The method of claim 1, wherein one or more of the first titanium silicide (TiSi) layer and the second titanium silicide (TiSi) layer have a ratio of titanium:silicon (Ti:Si) in a range of from 1:1 to 2:1.

15. The method of claim 1, wherein the second titanium silicide (TiSi) layer has a thickness that is greater than a thickness of the first titanium silicide (TiSi) layer.

16. A method comprising:

pre-cleaning a semiconductor substrate of a semiconductor structure in a semiconductor processing chamber to remove native oxides and form a cleaned semiconductor substrate; and exposing the cleaned semiconductor substrate to titanium tetrachloride ($TiCl_4$), silane ($SiH_4$), and hydrogen ($H_2$) by a thermal chemical vapor deposition (CVD) process to deposit a titanium silicide (TiSi) layer directly on the cleaned semiconductor substrate, wherein one or more of the titanium tetrachloride ($TiCl_4$) and the silane ($SiH_4$) are pulsed and purged while the hydrogen ($H_2$) and the other of the titanium tetrachloride ($TiCl_4$) and the silane ($SiH_4$) are continuously flowed in a carrier gas comprising argon (Ar), wherein the semiconductor structure comprises an n-type transistor and a p-type transistor, a first opening over the n-type transistor, and a second opening over the p-type transistor, and the titanium silicide (TiSi) layer selectively forms on a source/drain material of the n-type transistor and a source/drain material of the p-type transistor.

17. The method of claim 16, further comprising forming a capping layer on the titanium silicide (TiSi) layer.

18. The method of claim 17, wherein the capping layer is selected from one or more of titanium nitride (TIN), tantalum nitride (TaN), tungsten nitride (WN), molybdenum nitride (MoN), tungsten (W), molybdenum (Mo), and ruthenium (Ru).

19. The method of claim 18, further comprising depositing a gap fill material to fill one or more of the first opening or the second opening.

20. The method of claim 18, wherein the capping layer includes a first capping layer and a second capping layer, the first capping layer comprising one or more of selectively deposited tungsten (W) or selectively deposited molybdenum (Mo), and the second capping layer comprising one or more of PVD tungsten (W) or PVD molybdenum (Mo).

* * * * *